United States Patent

Iwata et al.

[11] Patent Number: 5,999,022
[45] Date of Patent: *Dec. 7, 1999

[54] SIGNAL TRANSMISSION DRIVER CIRCUIT, RECEIVER CIRCUIT, AND METHOD THEREOF FOR TRANSMITTING AND RECEIVING INFORMATION BASED ON MULTIPLE PERIODS AND/OR A DELAY FUNCTION

[75] Inventors: Toru Iwata, Osaka; Hironori Akamatsu, Hirakata; Hisakazu Kotani, Takarazuka; Hiroyuki Yamauchi, Takatsuki; Akira Matsuzawa, Yawata; Shoichiro Tada, Katano, all of Japan

[73] Assignee: Matsushita Electric Industrial Co., Ltd., Kadoma, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/631,914

[22] Filed: Apr. 15, 1996

[30] Foreign Application Priority Data

Apr. 17, 1995 [JP] Japan .................................. 7-090681

[51] Int. Cl.[6] .................................................. H03K 3/00
[52] U.S. Cl. .............................. 327/112; 327/211; 327/408
[58] Field of Search .......................... 327/108–112, 161, 327/403, 404, 199–230, 90, 91, 93, 94, 96–98, 276–278, 280, 281, 407–413; 326/59, 60

[56] References Cited

U.S. PATENT DOCUMENTS

| | | | |
|---|---|---|---|
| 3,949,242 | 4/1976 | Hirasawa et al. | 326/60 |
| 4,287,441 | 9/1981 | Smith | 327/91 |
| 4,295,099 | 10/1981 | Evans | 327/94 |
| 4,408,135 | 10/1983 | Yuyama et al. | 326/60 |
| 4,560,890 | 12/1985 | Masuda et al. | 327/91 |
| 4,611,135 | 9/1986 | Nakayama et al. | 327/404 |
| 4,808,854 | 2/1989 | Reinagel | 326/59 |
| 5,182,480 | 1/1993 | Goto | 327/266 |
| 5,187,390 | 2/1993 | Scott, III | 327/91 |
| 5,233,233 | 8/1993 | Inoue et al. | 327/408 |
| 5,250,913 | 10/1993 | Gleichert et al. | 327/269 |
| 5,274,273 | 12/1993 | Baginski et al. | 327/72 |
| 5,481,212 | 1/1996 | Shima | 327/91 |
| 5,483,283 | 1/1996 | Kannegundla | 326/59 |

FOREIGN PATENT DOCUMENTS

| | | | |
|---|---|---|---|
| 55-47733 | 4/1980 | Japan | 327/277 |
| 1147943 | 6/1989 | Japan . | |
| 5199255 | 8/1993 | Japan . | |
| 6-77791 | 3/1994 | Japan | 327/277 |

*Primary Examiner*—Kenneth B. Wells
*Attorney, Agent, or Firm*—Renner, Otto, Boisselle & Sklar, P.L.L.

[57] ABSTRACT

A driver circuit which drives a signal line includes a first output section for outputting a reference voltage potential to the signal line during a first period and a second output section for outputting one of a first information voltage potential and a second information voltage potential in accordance with an input signal during a second period.

14 Claims, 14 Drawing Sheets

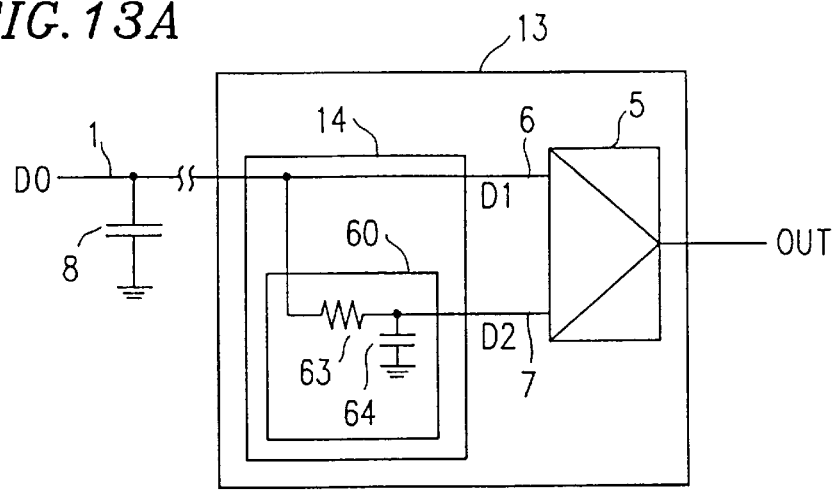
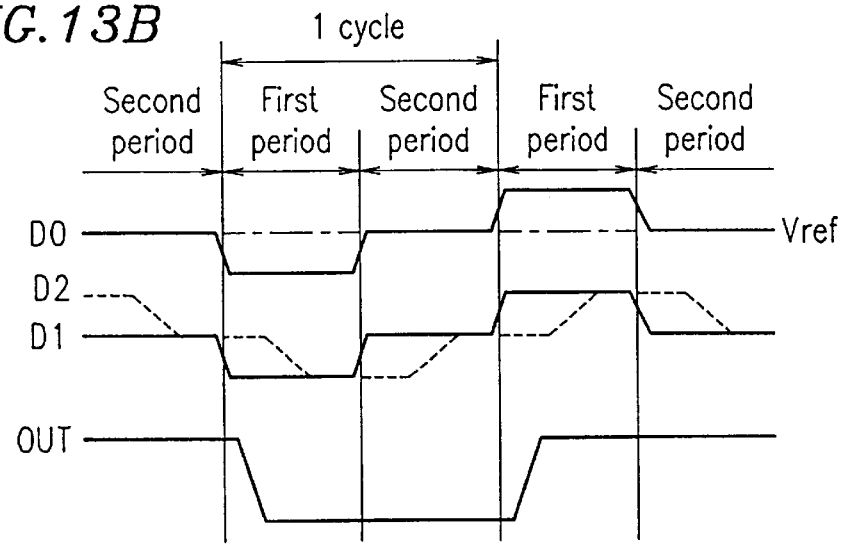
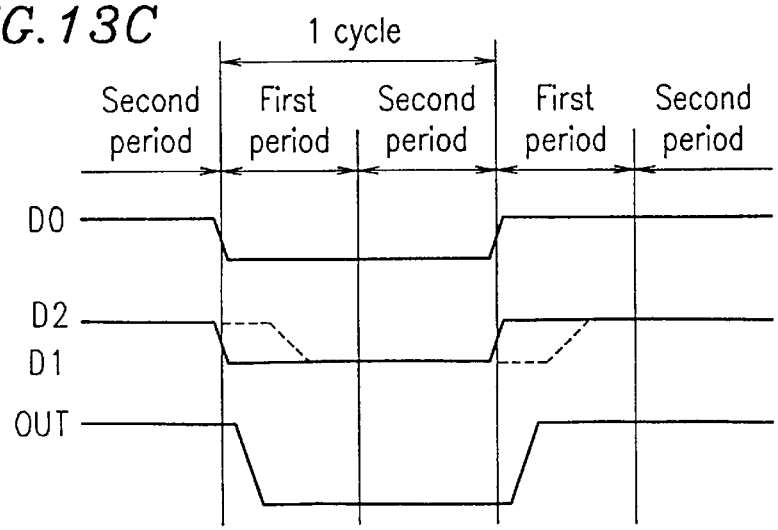

SIGNAL TRANSMISSION DRIVER CIRCUIT, RECEIVER CIRCUIT, AND METHOD THEREOF FOR TRANSMITTING AND RECEIVING INFORMATION BASED ON MULTIPLE PERIODS AND/OR A DELAY FUNCTION

BACKGROUND OF THE INVENTION

1. Field of the Invention

The present invention relates to a driver circuit which drives a signal line, a receiver circuit which receives signals transmitted through a signal line, and a signal transmission circuit which includes the driver circuit and the receiver circuit.

2. Description of the Related Art

Recently, a semiconductor integrated circuit has a larger size and faster operating speed. Consequently, it is becoming necessary to drive a long distance signal line with high speed.

FIGS. 1A to 1C each illustrates a construction of a conventional signal transmission circuit. The signal transmission circuit includes a signal line 201, a driver circuit 202, and a receiver circuit 203.

The driver circuit 202 drives the signal line 201 in accordance with a signal input to the signal transmission circuit, and varies voltage potential of the signal line 201. When the variation of the voltage potential of the signal line 201 propagates the end of the potential of the signal line 201, the receiver circuit 203 outputs a signal in accordance with the potential voltage at the end of the signal line 201. When the line distance of the signal line 201 is long and load capacitance related to signal transmission is large, power consumption due to the charging/discharging of the load capacitance becomes large, and signal transmission speed becomes slow because additional time is required for charging/discharging the load capacitance.

In the signal transmission circuit illustrated in FIG. 1B, an input signal is transformed into a signal having a small amplitude by the driver circuit 202, and the signal having the small amplitude is transmitted through the signal line 201. The transmitted signal is recovered to the original amplitude by the receiver circuit 203.

In the signal transmission circuit illustrated in FIG. 1B, amplitude of a signal passing through the signal line 201 is smaller compared to the signal transmission circuit illustrated in FIG. 1A. Therefore, the signal transmission circuit illustrated in FIG. 1B consumes less power than the signal transmission circuit illustrated in FIG. 1A does.

However, because of the small amplitude of the transmitted signal, the signal transmission circuit illustrated in FIG. 1B has low noise resistance. Therefore, it is difficult to reduce the amplitude of the transmitted signal so as to obtain a sufficient power consumption reduction effect.

In the signal transmission circuit illustrated in FIG. 1C, complementary signals in accordance with an input signal are transmitted through a pair of signal lines 201 and 201'. The two signal lines 201 and 201' are disposed adjacent to each other or very close to each other. This makes the noises received by both the signal lines 201 and 201' almost the same, thereby maintaining the potential difference between the complementary signals. Thus, by transmitting the complementary signals using the pair of signal lines 201 and 201', the potential difference between the signal lines 201 and 201' can be transmitted from the driver circuit 202 to the receiver circuit 203 even though the amplitude driving the signal lines is small. This makes it possible to reduce the power consumption required for driving the signal lines.

However, the signal transmission circuit illustrated in FIG. 1C requires two signal lines for the transmission of one signal. This increases the layout area for the signal lines.

Table 1 lists the results of evaluating the signal transmission circuits illustrated in FIGS. 1A to 1C with respect to three aspects, i.e., for power consumption, layout area, and noise resistance. In Table 1, "○" indicates that it is superior to other signal transmission circuits and "x" indicates that it is inferior to other signal transmission circuits.

TABLE 1

|  | Power consumption | Layout area | Noise resistance |
| --- | --- | --- | --- |
| Conventional (FIG. 1A) | X | ○ | ○ |
| Conventional (FIG. 1B) | ○ | ○ | X |
| Conventional (FIG. 1C) | ○ | X | ○ |
| Present invention | ○ | ○ | ○ |

As shown in Table 1, a conventional signal transmission circuit cannot simultaneously realize the three characteristics; that is, low power consumption, small layout area, and high noise resistance.

SUMMARY OF THE INVENTION

According to one aspect of the present invention, a driver circuit which drives a signal line includes a first output section for outputting a reference voltage potential to the signal line during a first period and a second output section for outputting one of a first information voltage potential and a second information voltage potential in accordance with an input signal during a second period.

In one embodiment of the present invention, the first period and the second period are alternately repeated.

In another embodiment of the present invention, each of the first output section and the second output section is controlled by a clock signal.

According to another aspect of the present invention, a receiver circuit which receives a signal transmitted through a first signal line includes a second signal line having a predetermined capacitance, a third signal line having a predetermined capacitance, and a control section for connecting the first signal line and the second signal line during a first period and for connecting the first signal line and the third signal line during a second period.

In one embodiment of the present invention, the control section includes a first switch for connecting the first signal line and the second signal line, and a second switch for connecting the first signal line and the third signal. The first switch and the second switch are controlled by a clock signal.

In another embodiment of the present invention, the clock signal is synchronous with the signal transmitted through the first signal line.

In still another embodiment of the present invention, the receiver circuit further includes an amplifier for amplifying a voltage potential difference between a voltage potential of the second signal line and a voltage potential of the third signal line.

In still another embodiment of the present invention, the amplifier includes a holding circuit for holding an output of the amplifier.

According to still another aspect of the present invention, a receiver circuit which receives a signal transmitted through a first signal line includes a second signal line, a third signal line, and a delay circuit for transmitting a voltage potential of the signal transmitted to the third signal line through the first signal line with a delay of a predetermined time duration. The second signal line is directly connected to the first signal line, and the third signal line is connected to the first signal line via the delay circuit.

In one embodiment of the present invention, the receiver circuit further includes an adjusting circuit for adjusting the delay time duration in accordance with a clock signal.

In another embodiment of the present invention, the receiver circuit further includes an amplifier for amplifying a voltage potential difference between a voltage potential of the second signal line and a voltage potential of the third signal line.

In still another embodiment of the present invention, the amplifier includes a holding circuit for holding an output of the amplifier.

According to still another aspect of the present invention, a signal transmission circuit includes a first signal line, a driver circuit which drives the first signal line, and a receiver circuit which receives a signal transmitted through the first signal line. The driver circuit includes a first output section for outputting a reference voltage potential to the first signal line during a first period, and a second output section for outputting one of a first information voltage potential and a second information voltage potential in accordance with an input signal during a second period. The receiver circuit includes a second signal line having a predetermined capacitance, a third signal line having a predetermined capacitance, and a control section for connecting the first signal line and the second signal line during a third period and for connecting the first signal line and the third signal line during a fourth period.

In one embodiment of the present invention, the signal transmitted through the first signal line is synchronous with a timing at which the third period and the fourth period are switched.

According to still another aspect of the present invention, a signal transmission circuit includes a first signal line, a driver circuit which drives the first signal line, and a receiver circuit which receives a signal transmitted through the first signal line. The driver circuit outputs one of a first information voltage potential and a second information voltage potential to the first signal line in accordance with an input signal. The receiver circuit includes a second signal line having a predetermined capacitance, a third signal line having a predetermined capacitance, and a control section for connecting the first signal line and the second signal line during a first period and for connecting the first signal line and the third signal line during a second period.

In one embodiment of the present invention, the signal transmitted through the first signal line is synchronous with a timing at which the first period and the second period are switched.

According to still another aspect of the present invention, a signal transmission circuit includes a first signal line, a driver circuit which drives the first signal line, and a receiver circuit which receives a signal transmitted through the first signal line. The driver circuit includes a first output section for outputting a reference voltage potential to the first signal line during a first period, and a second output section for outputting one of a first information voltage potential and a second information voltage potential in accordance with an input signal to the first signal line. The receiver circuit includes a second signal line, a third signal line, and a delay circuit for transmitting a voltage potential of the signal transmitted to the third signal line through the first signal line with a delay of a predetermined time duration. The second signal line is directly connected to the first signal line, and the third signal line is connected to the first signal line via the delay circuit.

According to still another aspect of the present invention, a signal transmission circuit includes a first signal line, a driver circuit which drives the first signal line, and a receiver circuit which receives a signal transmitted through the first signal line. The driver circuit outputs one of a first information voltage potential and a second information voltage potential to the first signal line in accordance with an input signal. The receiver circuit includes a second signal line, a third signal line, and a delay circuit for transmitting a voltage potential of the signal transmitted through the first signal line to the third signal line with a delay of a predetermined time duration. The second signal line is directly connected to the first signal line, and the third signal line is connected to the first signal line via the delay circuit.

Thus, the invention described herein makes possible the advantage of providing a driver circuit, a receiver circuit, and a signal transmission circuit which can simultaneously realize three characteristics, that is, low power consumption, small layout area, and high noise resistance.

These and other advantages of the present invention will become apparent to those skilled in the art upon reading and understanding the following detailed description with reference to the accompanying figures.

BRIEF DESCRIPTION OF THE DRAWINGS

FIG. 13A is a view illustrating a construction of a receiver circuit 13.

FIGS. 13B and 13C are time charts illustrating the operation of the receiver circuit 13.

DESCRIPTION OF THE PREFERRED EMBODIMENTS

Hereinafter, examples of the present invention will be described with reference to figures.

EXAMPLE 1

Figure 2:
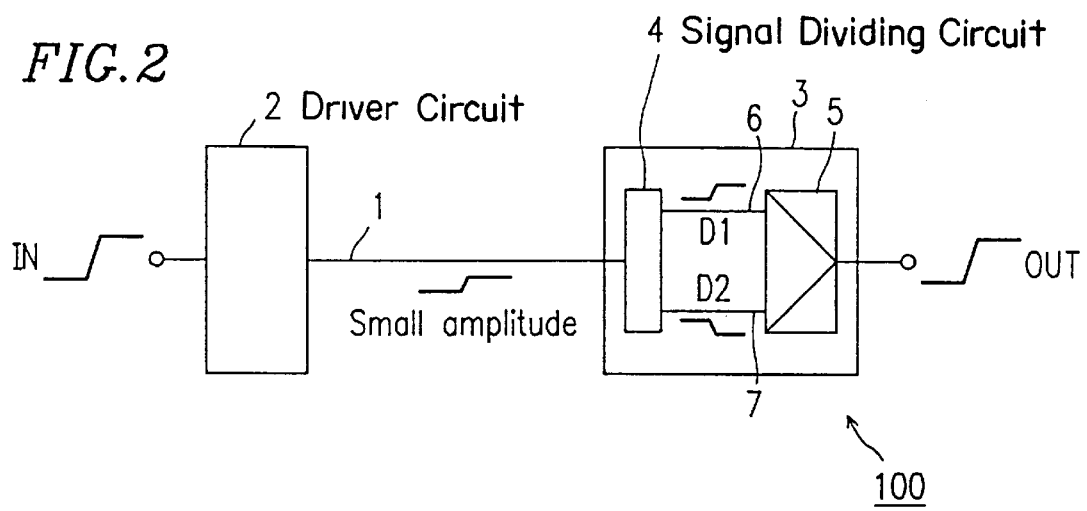
FIG. 2 is a view illustrating a construction of a signal transmission circuit 100 according to the present invention.

FIG. 2 illustrates a construction of a signal transmission circuit 100 according to the present invention. The signal transmission circuit 100 includes a signal line 1, a driver circuit 2, and a receiver circuit 3.

An input signal IN representing data of full level is input to the driver circuit 2. The driver circuit 2 transforms the input signal IN into a signal having small amplitude and sends out the transformed signal to the receiver circuit 3 through the signal line 1. A level of the signal transmitted from the driver circuit 2 to the receiver circuit 3 varies in accordance with the level of the input signal IN.

The receiver circuit 3 receives the signal transmitted from the driver circuit 2 through the signal line 1, and transforms the received signal into an output signal OUT representing data of full level, and outputs the output signal OUT. A level of the output signal OUT varies in accordance with the level of the signal transmitted from the driver circuit 2 to the receiver circuit 3.

The receiver circuit 3 includes a signal dividing circuit 4 and an amplifier 5.

The signal transmitted from the driver circuit 2 to the receiver circuit 3 is divided in a time-sharing manner by the signal dividing circuit 4 and is sent out through signal lines 6 and 7. For example, in a case where the driver circuit 2 generates alternately repeating signals of reference voltage potential and information voltage potential in accordance with the input signal IN, a timing at which the signal dividing circuit 4 divides the signal is set so as to be synchronized with the timing at which the reference voltage potential and information voltage potential of the signal switch themselves. This makes it possible to send out the reference voltage potential to the signal line 6 and the information voltage potential to the signal line 7. Small voltage potential difference between the reference voltage potential appearing at the signal line 6 and the information voltage potential appearing at the signal line 7 is amplified to data of full level by the amplifier 5. Then, the data-of full level is transmitted to the next stage. This means that it is possible to transmit the reference voltage potential and the information voltage potential (i.e., complementary data having small amplitude of voltage potential) through a single signal line.

Hereinafter, each component circuit included in the signal transmission circuit 100 according to the present invention will be described in detail with reference to figures.

Figure 3A:
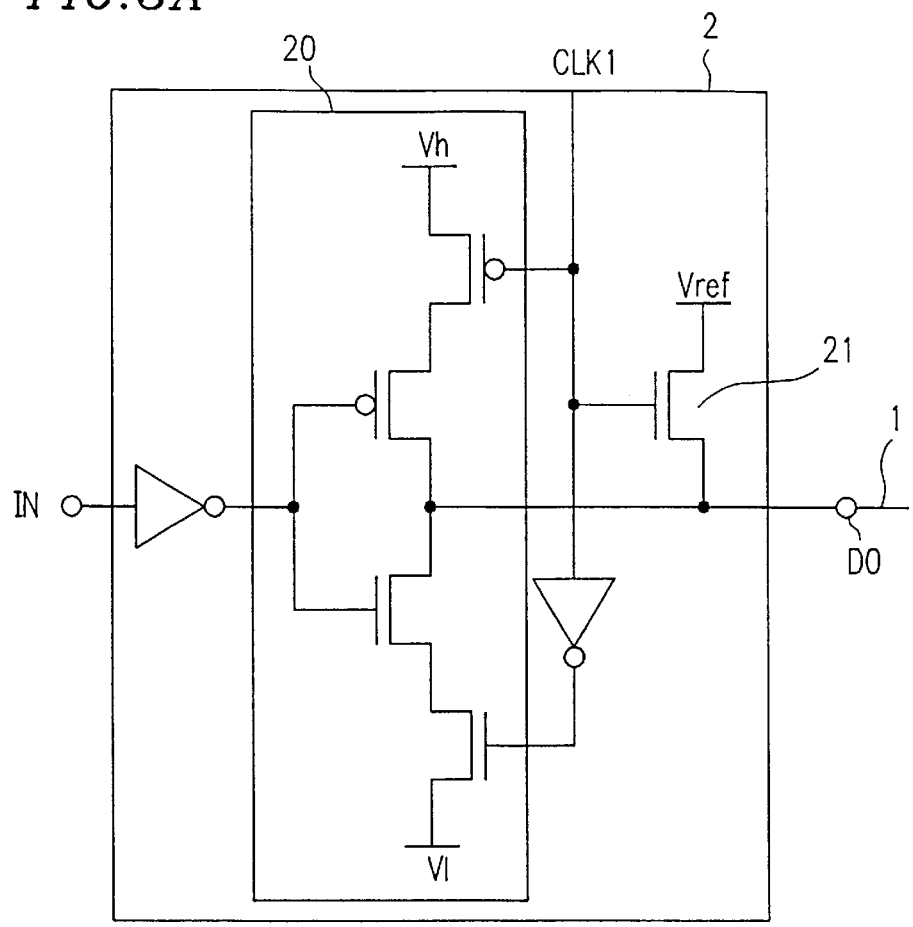
FIG. 3A is a view illustrating a construction of a driver circuit 2 in the signal transmission circuit 100.

FIG. 3A illustrates a construction of the driver circuit 2 in the signal transmission circuit 100. The driver circuit 2 includes a clocked invertor 20 which is controlled by a clock CLK1 and a transistor 21 which supplies reference voltage potential Vref to the output node D0 of the driver circuit 2. The power source of the clocked invertor 20 is supplied with voltages Vh and Vl where the voltages Vh and Vl are set such that the voltage potential difference therebetween becomes sufficiently small.

When the clock CLK1 is at low level, the driver circuit 2 outputs either the voltage Vh or the voltage Vl depending on the input signal IN. When the clock CLK1 changes its state from a low level to a high level, the output of the clocked invertor 20 becomes a high impedance state and the transistor 21 makes a transition to an on-state. As a result, the output node D0 of the driver circuit 2 is supplied with the reference voltage potential Vref.

Figure 3B:
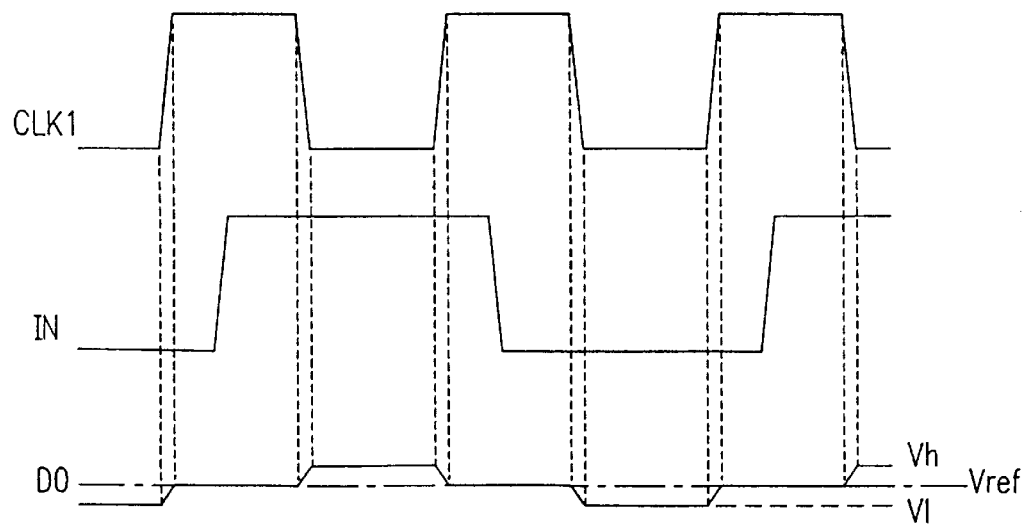
FIG. 3B is a view illustrating waveforms of signals in a driver circuit 2.

FIG. 3B illustrates waveforms for the clock CLK1 and the input signal IN which are input to the driver circuit 2 and a waveform of the signal at the output node D0 of the driver circuit 2. Hereinafter, the signal at the output node D0 of the driver circuit 2 is referred as "a signal D0".

A period where the input signal IN is at a high level is set so as to include a period where the clock CLK1 is at a low level. Thus, a signal which alternately repeats the reference voltage potential and the information voltage potential in synchronization with the clock CLK1 and has an amplitude (Vh−Vl) which is output from the output node D0 of the driver circuit 2.

Figure 4A:
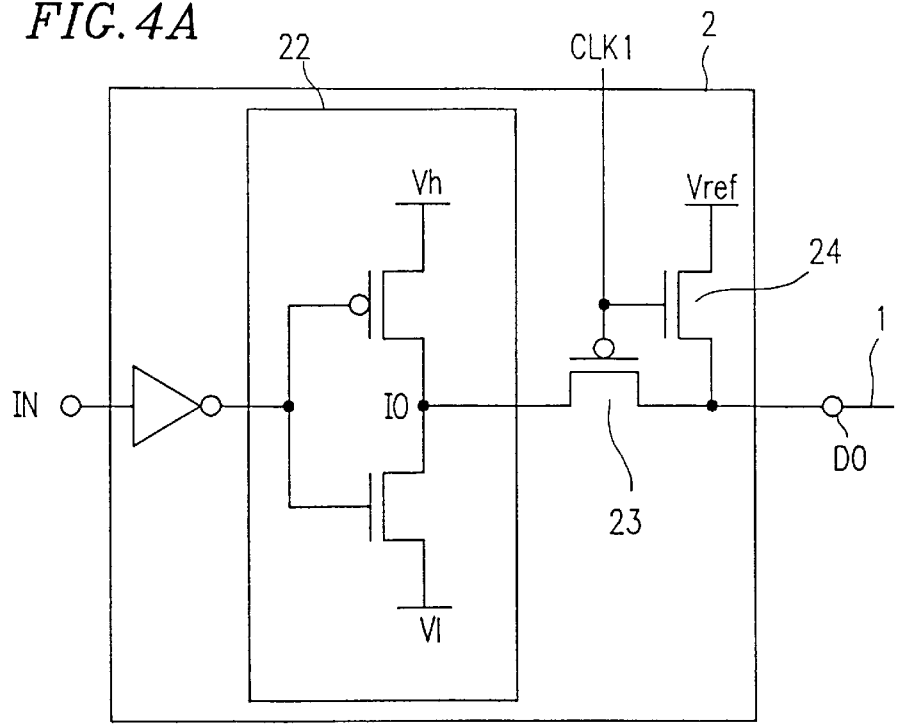
FIG. 4A is a view illustrating another construction of a driver circuit 2.

FIG. 4A illustrates another construction of the driver circuit 2. The driver circuit 2 illustrated in FIG. 4A includes an invertor 22 which is supplied with voltages Vh and Vl as a power supply, a transistor 23 which electrically connects an output node IO of the invertor 22 and an output node D0 of the driver circuit 2, and a transistor 24 which transmits reference voltage potential Vref to the output node D0 of the driver circuit 2. The gate of the transistor 23 is controlled by the clock CLK1.

The invertor 22 outputs either the voltage Vh or the voltage Vl in accordance with an input signal IN. When the clock CLK1 is at a high level, the output node IO of the invertor 22 and the output node D0 of the driver circuit 2 are electrically isolated by the transistor 23. As a result, the reference voltage potential Vref is output to the output node D0 of the driver circuit 2 through the transistor 24. If the clock CLK1 makes a transition from high level to a low level, the transistor 24 is turned on and the transistor 23 is turned off. As a result, the reference voltage potential Vref is isolated from the output node D0 of the driver circuit 2, and the output of the invertor 22 is transmitted to the output node D0 as the output of the driver circuit 2.

Figure 4B:
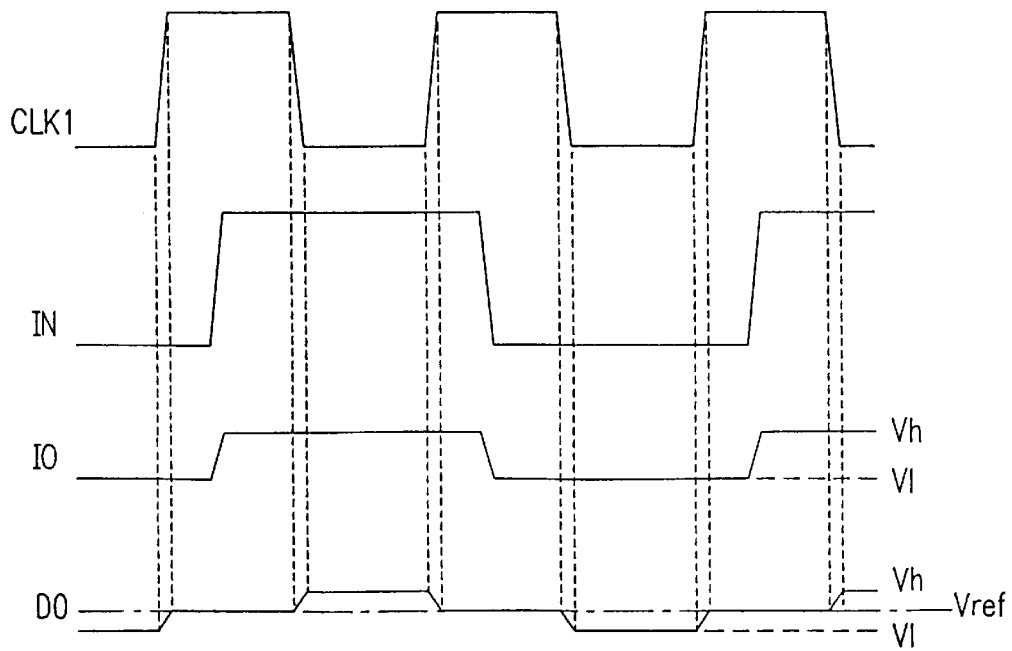
FIG. 4B is a view illustrating waveforms of signals in a driver circuit 2.

FIG. 4B illustrates waveforms of the clock CLK1 and the input signal IN which are input to the driver circuit 2, a waveform of a signal at the output node IO of the invertor 22, and a waveform of a signal at the output node D0 of the driver circuit 2.

A period where the input signal IN is at a high level is set so as to include a period where the clock CLK1 is at a low level. Thus a signal which alternately repeats the reference voltage potential and the information voltage potential in synchronization with the clock CLK1 and has an amplitude (Vh−Vl) are output from the output node D0 of the driver circuit 2.

Figure 5:
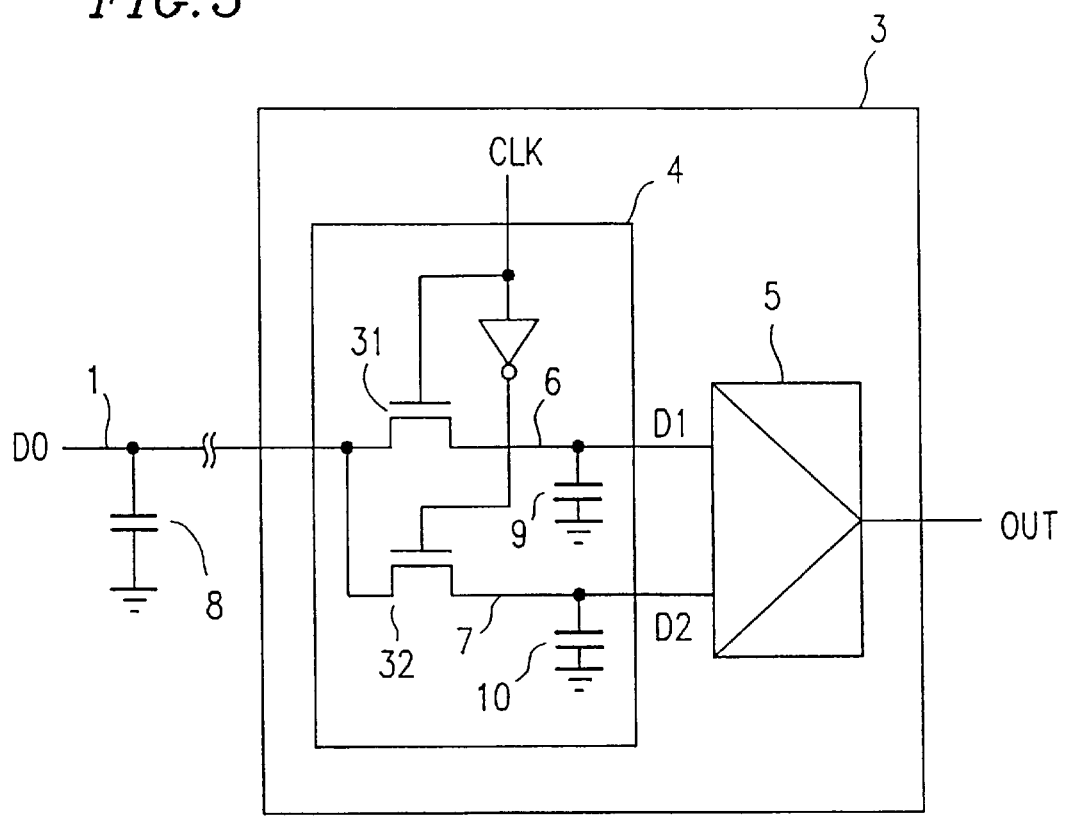
FIG. 5 is a view illustrating a construction of a receiver circuit 3 in the signal transmission circuit 100.

FIG. 5 illustrates a construction of the receiver circuit 3 of the signal transmission circuit 100. The receiver circuit 3 includes a signal dividing circuit 4 and an amplifier 5. The signal dividing circuit 4 is connected to the signal line 1 for transmitting the signal at the output node D0 of the driver circuit 2.

The signal dividing circuit 4 includes signal lines 6 and 7, a switch 31 which electrically connects the signal line 1 and the signal line 6 and is controlled by the clock CLK, and a switch 32 which electrically connects the signal line 1 and the signal line 7 and is controlled by inverted signals of the clock CLK. The switches 31 and 32 may be, for example, MOS transistors, respectively. In FIG. 5, reference numeral 8 denotes a capacitance of the signal line 1, reference numeral 9 denotes a capacitance of the signal line 6, and reference numeral 10 denotes a capacitance of the signal line 7.

Figure 6:
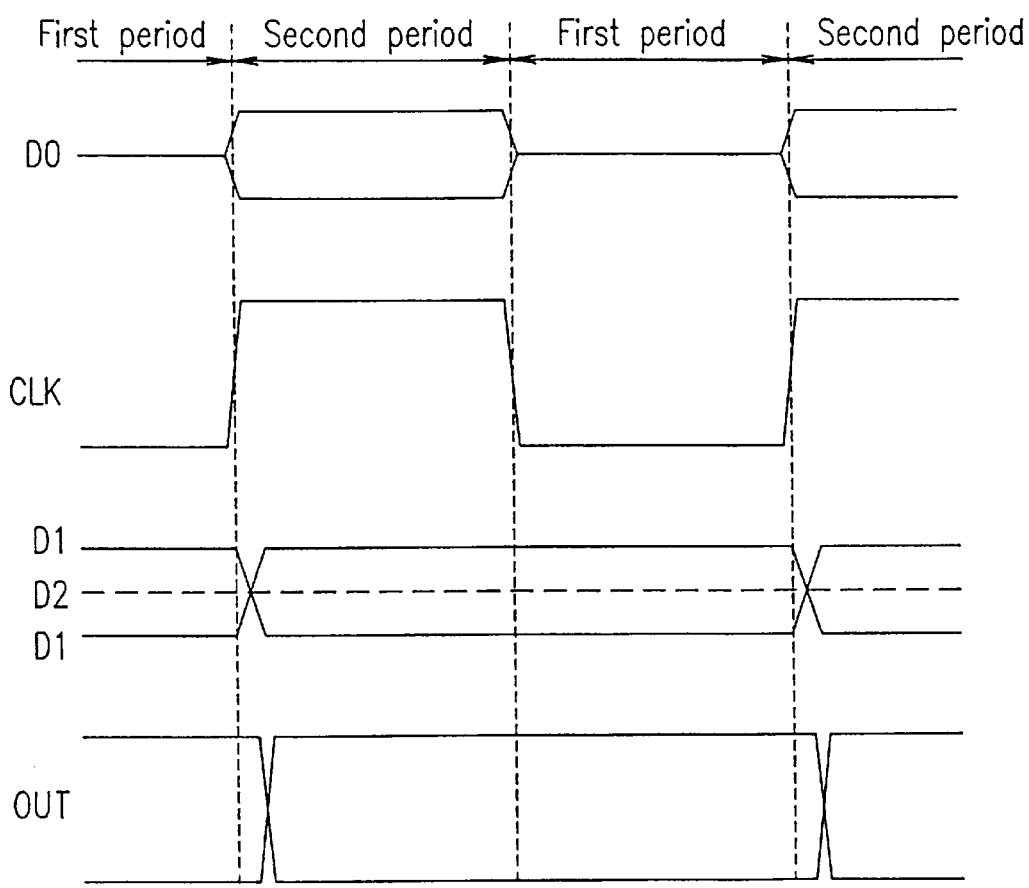
FIG. 6 is a time chart illustrating the operation of the receiver circuit 3.

FIG. 6 is a time chart illustrating operation of the receiver circuit 3 illustrated in FIG. 5. Hereinafter, the operation of the receiver circuit 3 will be described with reference to FIG. 6. Herein, a signal D0, which is transmitted through the signal line 1, has the reference voltage potential in a first period and the information voltage potential in a second period. The information voltage potential is in either a high level or a low level. The first period and the second period are alternately repeated.

The switches 31 and 32 are controlled by the clock CLK. Either the signal line 6 or the signal line 7 is connected to the signal line 1 in accordance with the level of the clock CLK. The clock CLK is in synchronization with the signal D0. For example, during the first period, the MOS transistor switch 32 is turned on and the signal line 7 is connected to the signal line 1. As a result, voltage potential D2 of the signal line 7 becomes the reference voltage potential. During the second period, the MOS transistor switch 31 is turned on and the signal line 6 is connected to the signal line 1. As a result, voltage potential D1 of the signal line 6 becomes the information voltage potential which is either high or low.

The voltage potential D2 (reference voltage potential) of the signal line 7 in the first period is held during the second period by the capacitance 10 of the signal line 7. This is because the MOS transistor switch 32 is turned off during the second period. Similarly, the voltage potential D1 (information voltage potential) of the signal line 6 in the second period is held during the first period by the capacitance 9 of the signal line 6. This is because the MOS transistor switch 31 is turned off during the first period.

As described above, the reference voltage potential and the information voltage potential which are alternately sent through the signal line 1 during the first period and the second period with a time lag are transmitted to the signal lines 6 and 7 at the same time. This means that the reference voltage potential and the information voltage potential (i.e., complementary data) can be transmitted by using a single signal line.

The shorter the lengths of the signal lines 6 and 7 are in comparison with the length of the signal line 1, the smaller the layout area of the signal transmission circuit 100 is. However, it is preferable that the capacitances 9 and 10 of the signal lines 6 and 7, respectively, have a certain value of capacitance such that it is possible for the signal line 6 (or signal line 7) to retain a stable voltage potential during a period where the MOS transistor switch 31 (or MOS transistor switch 32) is turned off. Certainly, it is possible to use a gate capacitance or the like to increase the capacitance values of the signal lines 6 and 7 while the lengths of the signal lines 6 and 7 are kept short.

Moreover, it is only necessary for the signal D0 of the driver circuit 2 and the clock CLK controlling the MOS transistor switches 31 and 32 to be synchronized with each other. It is not required that edge timings of the signal D0 and the clock CLK are the same. As long as a voltage potential difference of a certain value or more is obtained at the signal lines 6 and 7 at the same time, the edge timings of the signal D0 and the clock CLK may be different. It is preferable that the difference between the voltage potential of the signal line 6 and that of the signal line 7 is large.

Next, advantages of the signal transmission circuit 100 according to the present invention will be described with reference to FIGS. 7A to 7C.

Figure 1A:
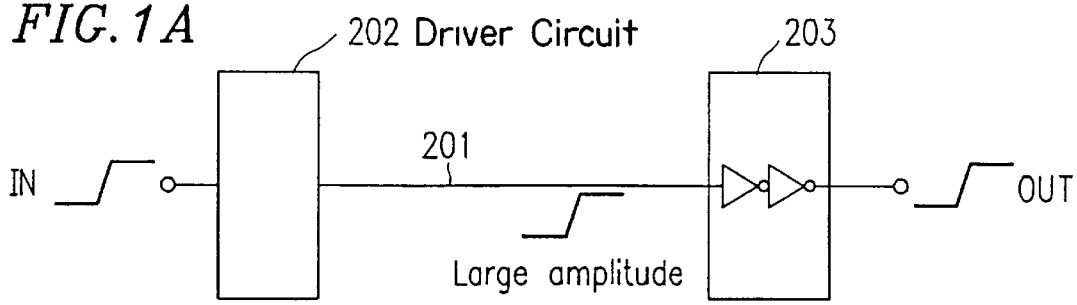
FIGS. 1A to 1C are views illustrating constructions of conventional signal transmission circuits.
Figure 1B:
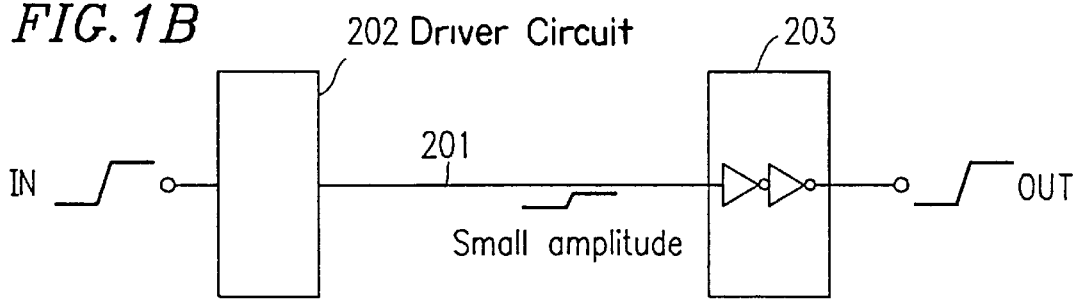
Figure 7A:
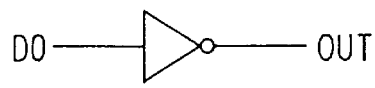
FIG. 7A is a view illustrating the construction of the conventional receiver circuit.
Figure 7B:
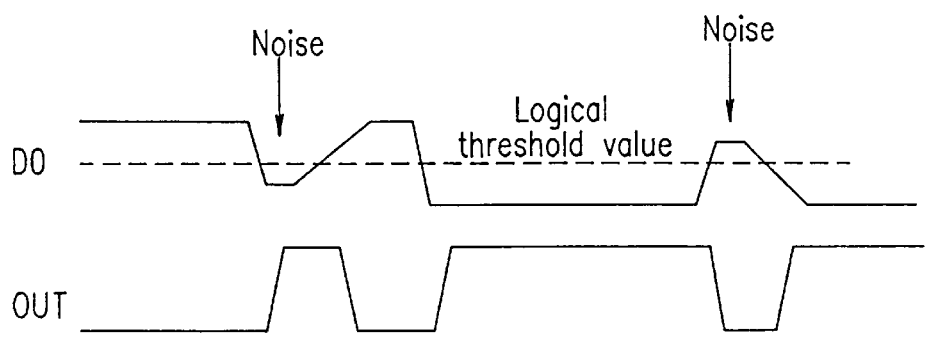
FIG. 7B is a time chart illustrating the operation of the conventional receiver circuit.
Figure 7C:
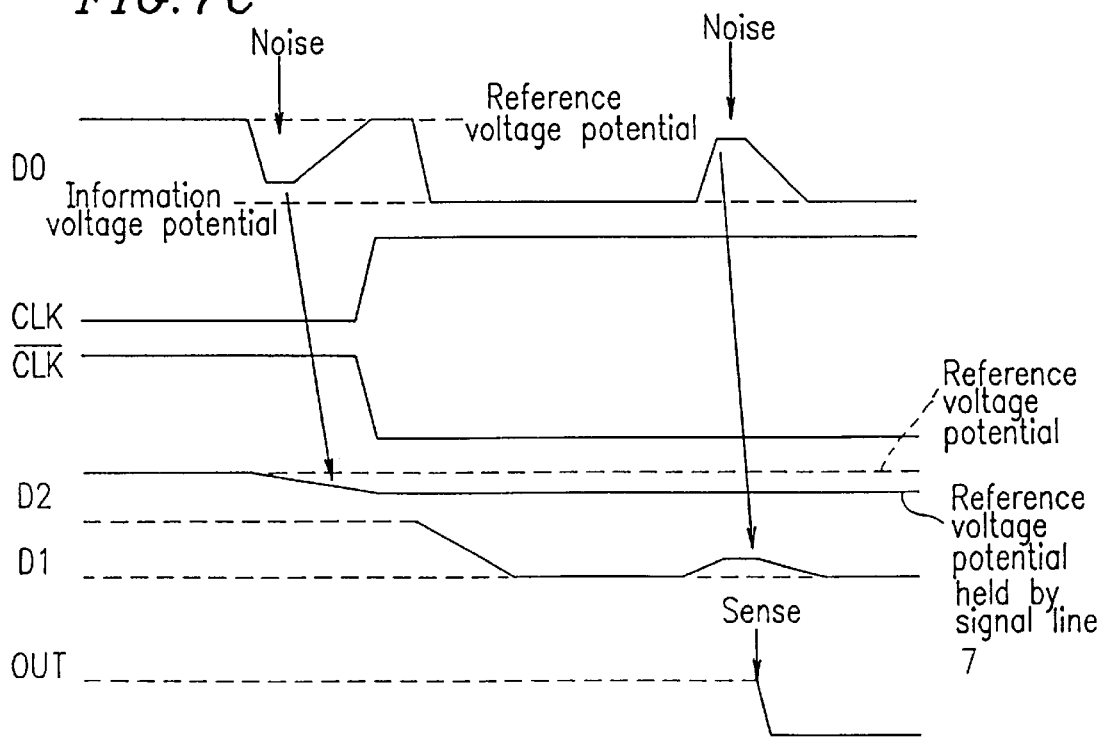
FIG. 7C is a time chart illustrating the operation of the receiver circuit 3.

FIG. 7A illustrates a construction of the receiver circuit (simple invertor circuit) in the conventional signal transmission circuit illustrated in FIG. 1B. Since in the conventional signal transmission circuit illustrated in FIG. 1B a signal amplitude to be transmitted through a signal line is set at a small voltage potential difference, fluctuation of the signal voltage due to a noise from outside becomes relatively large compared to the signal level. Therefore, it is likely that the conventional receiver circuit illustrated in FIG. 7A erroneously operates as the noise level exceeds the logical threshold voltage potential value of the invertor circuit (see FIG. 7B).

On the other hand, since the receiver circuit 3 (FIG. 5) according to the present invention has the MOS transistor 32 and the capacitance 10 in a signal transmission path from the signal line 1 to the signal line 7, a transmission delay occurs. That is, in a case where a noise occurs during transmission of the reference voltage potential to the signal line 7, since the MOS transistor 31 and the capacitance 9 serve as a filter, an amount of fluctuation of the voltage potential D2 retained at the signal line 7 from the reference voltage potential is small compared to the noise level (see FIG. 7C).

Similarly, influence of the noise toward the voltage potential D1 appearing as the information voltage potential at the signal line 6 is also lessened. Even in the case where a noise is added to the signal D0, if the voltage potential D1 of the signal line 6 when the amplifier is activated is closer to the information voltage potential side rather than the voltage potential D2 (reference potential) retained at the signal line 7 is, then it is possible to output correct data by the amplifier 5 (see FIG. 7C). Therefore, according to the present invention, the influence of a noise is lessened due to the above-mentioned filtering effect, thereby increasing a margin for a noise.

The noise margin described so far has been directed at a noise appearing at the signal line 1. Influence of noises appearing at the signal lines 6 and 7 can be ignored. This is because the two signal lines 6 and 7 can be disposed very close to each other so that amounts of fluctuation of voltage potential due to the noise are fundamentally equal. Therefore, data is stored and maintained in the signal lines 6 and 7 regardless of the noise level.

Also, there is a correlation between the time at which a noise enters the signal line 1 and the noise margin of the signal transmission circuit 100. If a noise occurs immediately before the MOS transistor 32 makes a transition to an off-state, the amount of difference of the voltage potential D2 retained at the signal line 7 with respect to the reference voltage potential is large. Furthermore, if a noise occurs immediately before the amplifier 5 is activated, the amount of difference of the voltage potential D1 appearing at the signal line 6 with respect to the information voltage potential also becomes large. Therefore, in a case where the timing of the occurrence of the noise is synchronized with signal transmission, the influence of the noise can further be lessened by changing the timing at which the MOS transistor 32 makes a transition from the on-state to the off-state or by changing the timing at which the amplifier 5 is activated.

As described above, the signal transmission circuit 100 according to the present invention has the advantages of high noise resistance and of maintaining the noise margin. Moreover, there is the advantage of requiring a small layout area for the signal transmission circuit 100 since the reference voltage potential and the signal voltage potential (i.e., complementary data) can be transmitted by using only a single signal line. Furthermore, there is also the advantage of small power consumption of the signal transmission circuit 100 since the amplitude of a signal transmitted through the single signal line is small.

Figure 1C:
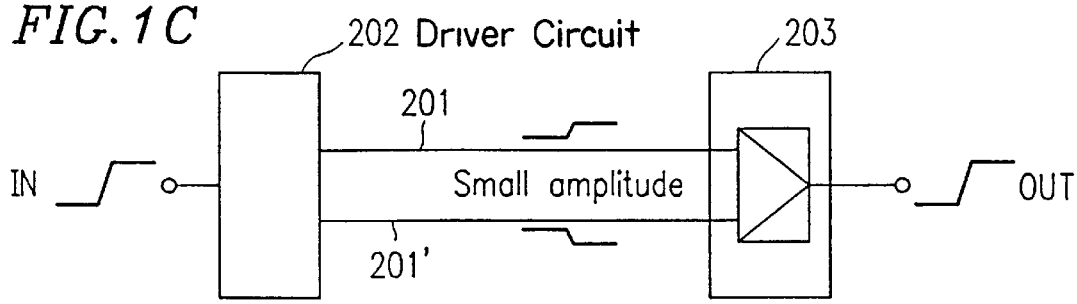

As described so far, the signal transmission circuit 100 according to the present invention is superior to the conventional signal transmission circuits illustrated in FIGS. 1A to 1C in that it simultaneously realizes the three characteristics of small power consumption, small layout area, and high noise resistance (see Table 1).

EXAMPLE 2

Figure 8:
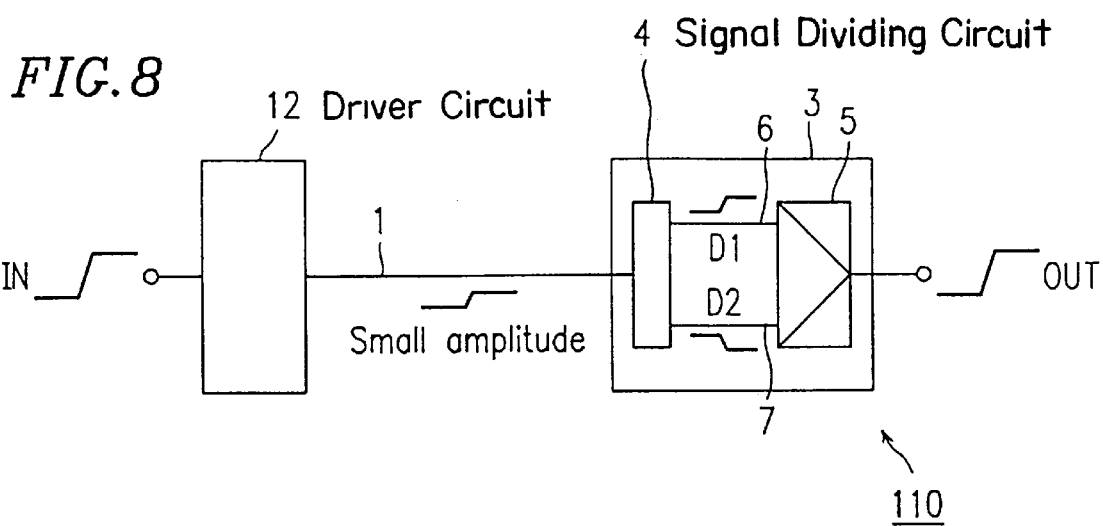
FIG. 8 is a view illustrating a construction of a signal transmission circuit 110 according to the present invention.

FIG. 8 illustrates a construction of a signal transmission circuit 110 according to the present invention. The signal transmission circuit 110 includes a signal line 1, a driver circuit 12, and a receiver circuit 3. The same components as those in the signal transmission circuit 100 illustrated in FIG. 2 are referred to with the same reference numerals.

Figure 9A:
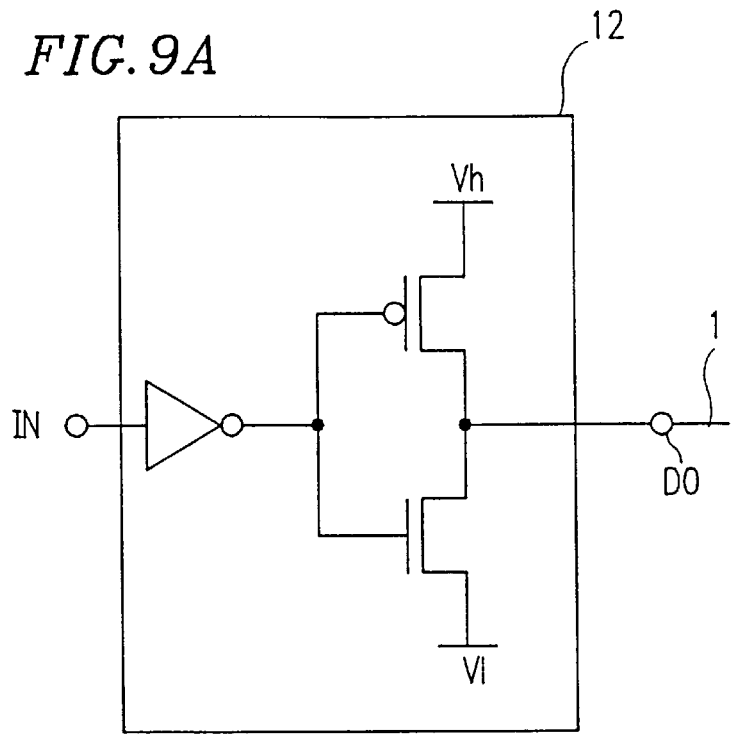
FIG. 9A is a view illustrating a construction of a driver circuit 12.

FIG. 9A illustrates a construction of the driver circuit 12 of the signal transmission circuit 110. The driver circuit 12 has an invertor whose high voltage potential power source side is connected to voltage potential Vh and whose low voltage potential power source side is connected to voltage potential Vl. The driver circuit 12 transforms the amplitude of an input signal IN into (Vh−Vl) and outputs the transformed signal. The values of the voltages Vh and Vl are set such that a value of (Vh−Vl) is smaller than a voltage potential difference between the power source voltage potential Vcc and the ground voltage potential Vss. With this construction, the driver circuit 12 sends out a signal having small amplitude and successive information voltage potentials to the receiver circuit 3.

Figure 9B:
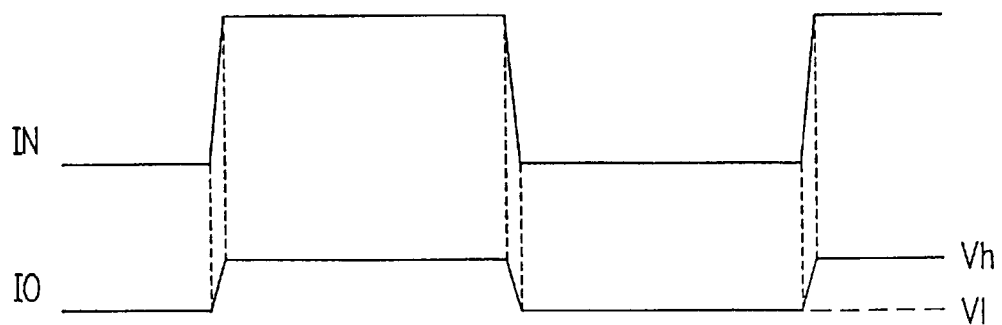
FIG. 9B is a view illustrating waveforms of signals in the driver circuit 12.

FIG. 9B illustrates a waveform of the input signal IN which is input to the driver circuit 12 and a waveform of a signal at the output node D0 of the driver circuit 12.

A construction of the receiver circuit 3 is the same as shown in FIG. 5. The receiver circuit 3 receives a signal having a small amplitude through a single signal line and transforms it to a signal of full level. The signal thus transformed is transmitted as data to the next stage circuit.

Figure 10:
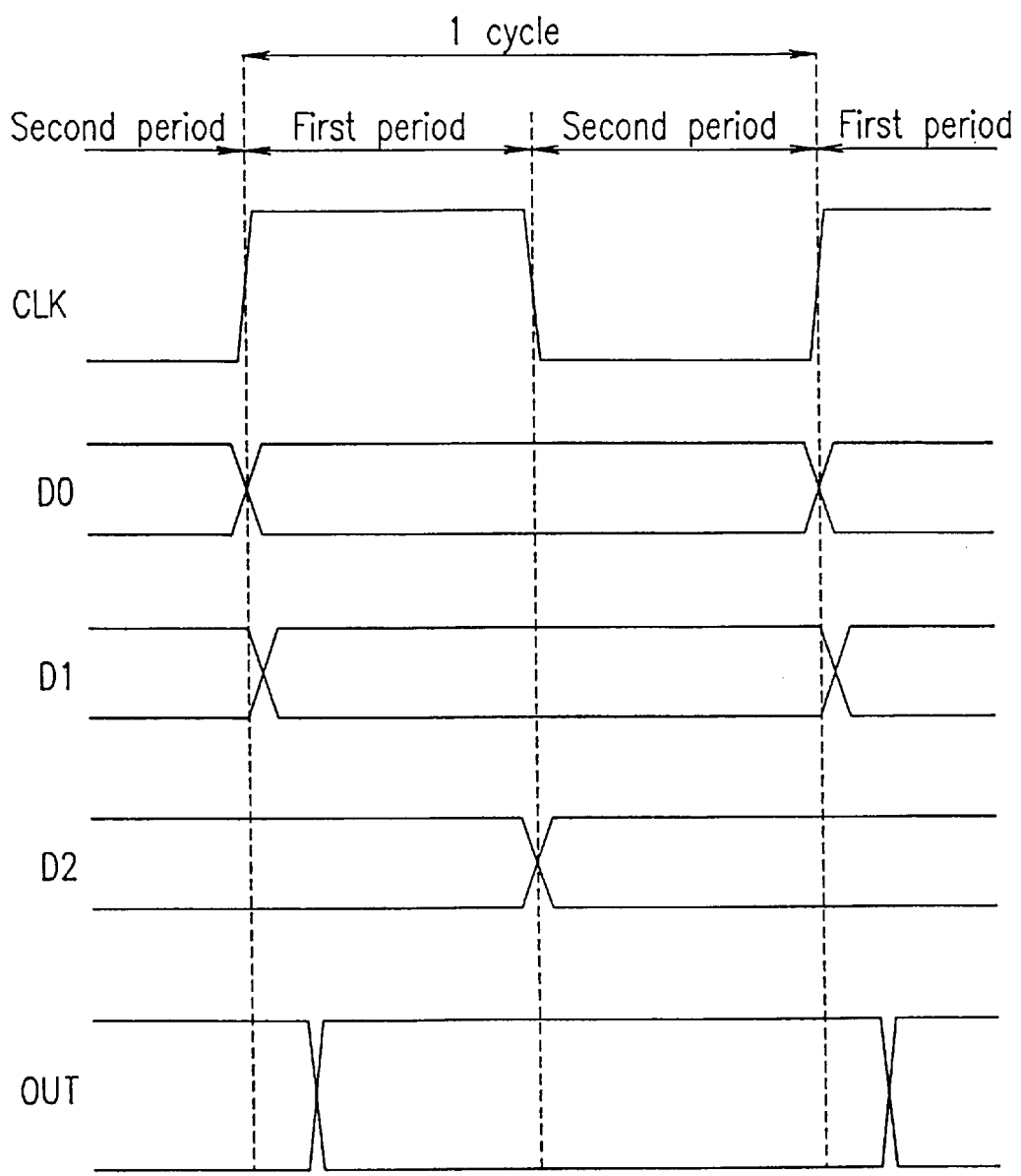
FIG. 10 is a time chart illustrating the operation of the receiver circuit 3.

FIG. 10 is a time chart illustrating the operation of the receiver circuit 3. Hereinafter, the operation of the receiver circuit 3 will be described with reference to FIG. 10.

A signal D0 at the output node D0 of the driver circuit 12 has successive information voltage potentials. The signal D0 has an information voltage potential which is either high or low throughout one cycle.

The clock CLK is input to the signal dividing circuit 4 (FIG. 5). The clock CLK is in synchronization with a signal which is obtained by doubling the frequency of the signal D0. The clock CLK alternately repeats first periods and second periods.

According to the clock CLK, the signal D0 in the first period is received by the signal dividing circuit 4 as the information voltage potential D1. As a result, the information voltage potential D1 appears at the signal line 6 (FIG. 5). The information voltage potential D1 is held at the signal line 6 during the second period following the first period. According to the clock CLK, the signal D0 in the second period is received by the signal dividing circuit 4 as the information voltage potential D2. As a result, the information voltage potential D2 appears at the signal line 7 (FIG. 5). The information voltage potential D2 is held at the signal line 7 during the first period following the second period.

Hereinafter, the operation of the receiver circuit 3 in a case where the voltage potential of the signal D0 in one cycle (current cycle) differs from that in another cycle immediately prior to the current cycle (previous cycle). Suppose that the signal D0 is high (Vh) in the previous cycle and is low (Vl) in the current cycle. In this case, the signal D0 (high) in the second period of the previous cycle is received by the signal dividing circuit 4 as the information voltage potential D2, and the information voltage potential (high) is held at the signal line 7. The signal D0 (low) in the first period of the current cycle is received by the signal dividing circuit 4 as the information voltage potential D1.

The differential amplifier 5 (FIG. 5) amplifies a voltage potential difference between the information voltage potentials D1 and D2 in the first period of the current cycle, and then judges whether the information voltage potential D1 in the first period of the current cycle is higher or lower than a reference voltage potential where the information voltage potential D2 in the second period of the previous cycle is taken as the reference voltage. The differential amplifier 5 then sends out an output signal OUT in accordance with the judgment result.

As described above, data corresponding to the signal D0 in the current cycle is output from the receiver circuit 3.

When voltage potentials of the signal D0 of the previous cycle and the signal D0 of the current cycle are equal, the information voltage potentials D1 and D2 in the first period of the current cycle become equal. In this case, data corresponding to the signal D0 of the current cycle cannot be specified by amplifying the voltage potential difference between the information voltage potentials D1 and D2 in the first period of the current cycle. Such a problem is solved by using an amplifier with a latch mechanism according to the invention.

Figure 11A:
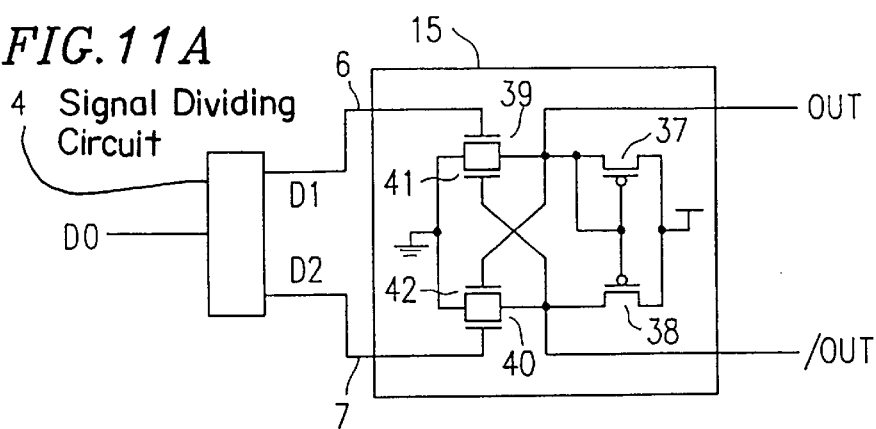
FIG. 11A is a view illustrating a construction of a differential amplifier 15 having a latch mechanism.

FIG. 11A illustrates a construction of a differential amplifier 15 having a latch mechanism. The differential amplifier 15 is connected to the signal lines 6 and 7 of the signal dividing circuit 4. The information voltage potentials D1 and D2 appear at the signal lines 6 and 7, respectively.

The differential amplifier 15 is obtained by adding a latch mechanism to a static differential amplifier for automatically amplifying voltage potential difference between the information voltage potentials D1 and D2 when the voltage potential difference becomes greater than a prescribed voltage potential difference. The latch mechanism latches the amplified result by the static differential amplifier.

The differential amplifier 15 includes PMOS transistors 37 and 38 which are the current source for the differential amplifier 15, NMOS transistors 39 and 40 as input transistors, and NMOS transistors 41 and 42 which latch the output of the differential amplifier 15. The gates of the input transistors 39 and 40 are connected to the signal lines 6 and 7, respectively.

Figure 11B:
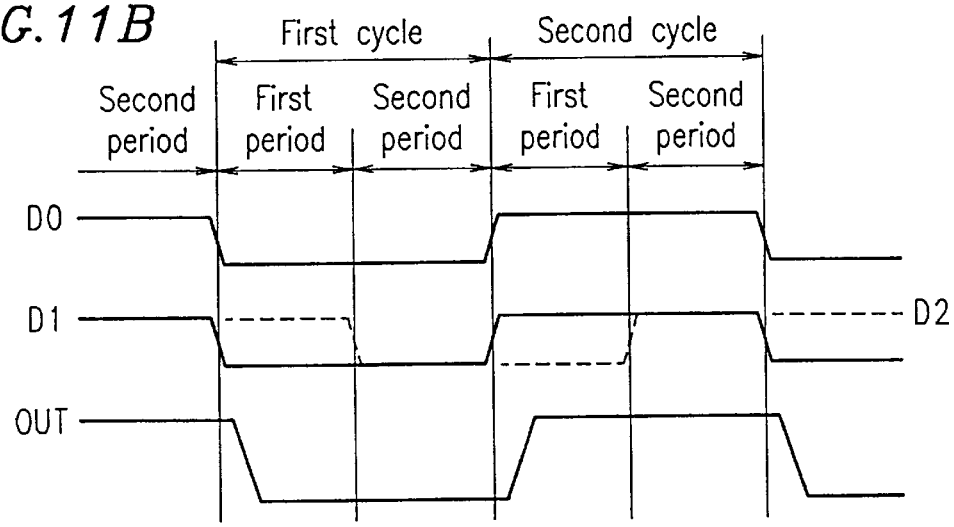
FIGS. 11B and 11C are time charts illustrating the operation of the differential amplifier 15.
Figure 11C:
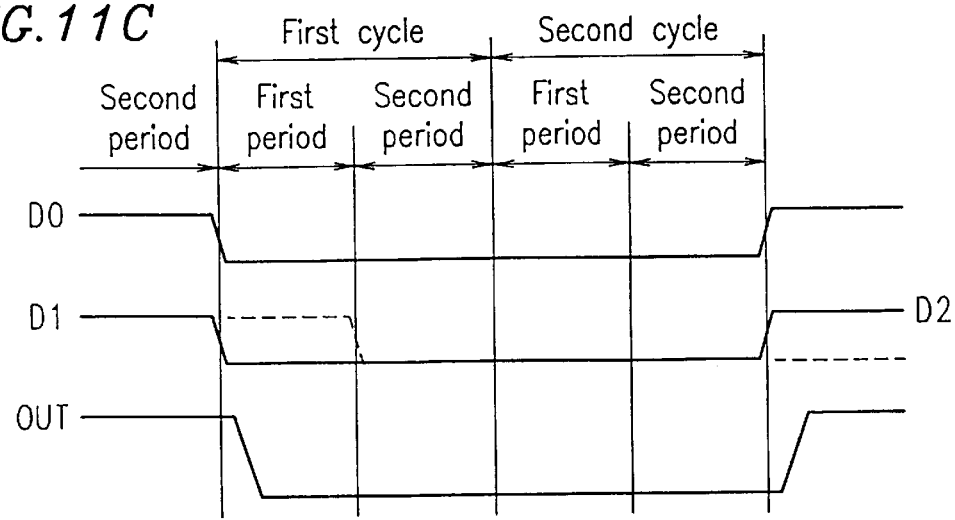

FIGS. 11B and 11C are time charts illustrating operation of the differential amplifier 15.

FIG. 11B illustrates the operation of the differential amplifier 15 in a case where voltage potential of the signal D0 changes for every cycle (for example, case where the signal D0 is a clock signal).

In this case, a voltage potential difference corresponding to the data between the information voltage potentials D1 and D2 appears in the first period of each cycle. Therefore, by amplifying the voltage potential difference between the information voltage potentials D1 and D2 of the first period of each cycle, the differential amplifier 15 operates correctly. That is, the differential amplifier 15 outputs an output signal OUT corresponding to the signal D0.

FIG. 11C illustrates the operation of the differential amplifier 15 in a case where voltage potential of the signal D0 in a first cycle and that of the signal D0 in a second cycle immediately following the first cycle are equal.

In this case, a voltage potential difference between the information voltage potentials D1 and D2 in the second cycle is zero, and the differential amplifier 15 is in a state of self-equalization. In this state, an ordinary differential amplifier does not operate correctly. However, as described above, the differential amplifier 15 with the latch mechanism has a function of holding data fixed in the previous cycle even during the current cycle. This makes it possible for the differential amplifier 15 to output an output signal OUT corresponding to the signal D0 even in a case where the voltage potential of the signal D0 of the current cycle does not change from that of the previous cycle, thereby creating no voltage potential difference between the information voltage potentials D1 and D2.

Hereinafter, operation of the differential amplifier 15 will be described in detail.

Constant current from the PMOS transistors 37 and 38 serving as current sources flows through the NMOS transistors 39 and 40. The gates of the NMOS transistors 39 and 40 are supplied with the information voltage potentials D1 and D2, respectively. If a voltage potential difference occurs between the information voltage potentials D1 and D2, a difference occurs between the impedances of the NMOS transistors 39 and 40. This creates a difference between the amounts of voltage potential drop due to the NMOS transistors 39 and 40. This difference in the voltage potential appears as the difference between the output voltages OUT and /OUT.

The output voltages OUT and /OUT are input to the NMOS transistors 41 and 42, respectively, which are connected to each other in a cross-coupling manner. Specifically, the output voltage /OUT is input to the gate of the NMOS transistor 41, and the output voltage OUT is input to the gate of the NMOS transistor 42.

For instance, as illustrated in FIG. 1C, when the signal D0 is low throughout the first and second cycles, The NMOS transistor 41 is turned off and the NMOS transistor 42 is turned on. Even if the voltage potential difference between the information voltage potentials D1 and D2 becomes zero and the difference between the current drawing amounts of the NMOS transistors 39 and 40 becomes zero, the voltage potential difference between the output voltages OUT and /OUT is held by the difference between the current drawing amounts of the NMOS transistors 41 and 42.

Polarity of the power source and the MOS transistors in the differential amplifier 15 may be opposite to that described above. Even in that case, it is possible for the differential amplifier 15 to operate similarly as described above.

Furthermore, in the example illustrated in FIG. 11A, the MOS transistors 41 and 42 for latching data are inserted parallel with respect to the MOS transistors 39 and 40 which receive differential input. MOS transistors for latching data may be inserted in series with respect to MOS transistors which receive differential input.

The differential amplifier 15 illustrated in FIG. 11A is not suited for dynamic operation controlled by the power source. This is because if it is attempted to reduce power consumption by cutting off the power source, the output voltages OUT and /OUT become unstable and the latched data are lost.

In order to solve this problem, a latch circuit which latches the output voltages OUT and /OUT of the differential amplifier is provided independent of the differential amplifier and the output of the latch circuit is fed back to the differential amplifier. In this way, dynamic operation of the differential amplifier becomes possible.

Figure 12A:
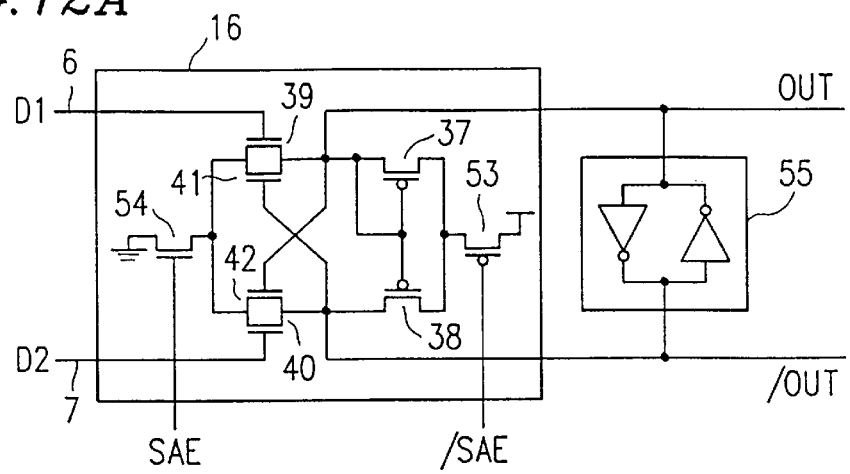
FIG. 12A is a view illustrating constructions of a differential amplifier 16 which is capable of performing a dynamic operation and a latch circuit 55.

FIG. 12A illustrates constructions of a differential amplifier 16 which is capable of dynamic operation and a latch circuit 55. The construction of the differential amplifier 16 is the same as that of the differential amplifier 15 except that NMOS transistors 53 and 54 for the dynamic operation have been added.

The NMOS transistor 53 is inserted between the current source and the power source line of the differential amplifier 16. The NMOS transistor 54 is inserted between the source node and the ground line.

An activation signal /SAE is input to the gate of the NMOS transistor 53. An activation signal SAE is input to the gate of the NMOS transistor 54.

Figure 12B:
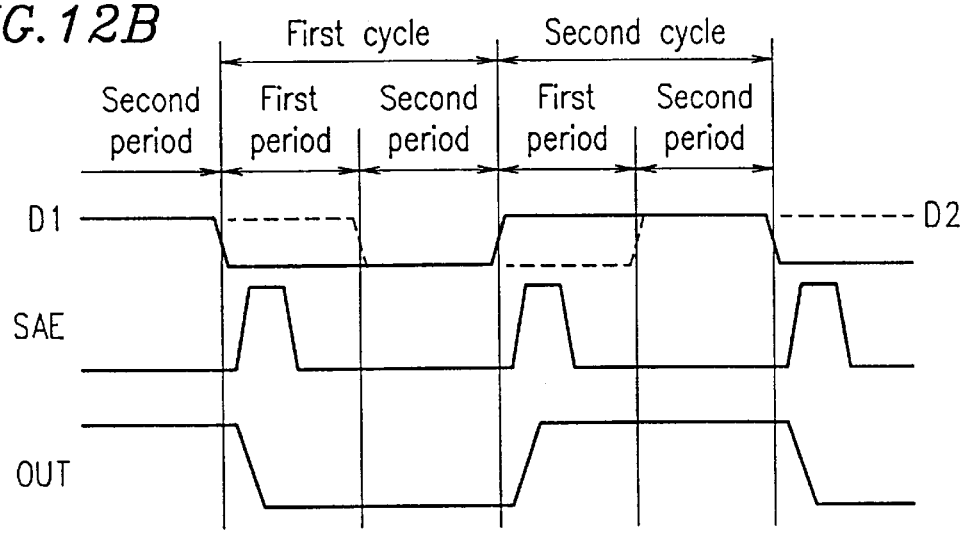
FIGS. 12B and 12C are timing charts illustrating the operation of the differential amplifier 16 and the latch circuit 55.

When the activation signal SAE proceeds to a high level, both NMOS transistors 53 and 54 become of a on-state. This activates the differential amplifier 16. The differential amplifier 16 outputs output voltages OUT and /OUT in accordance with the voltage potential difference between the information voltage potentials D1 and D2 (see FIG. 12B).

Figure 12C:
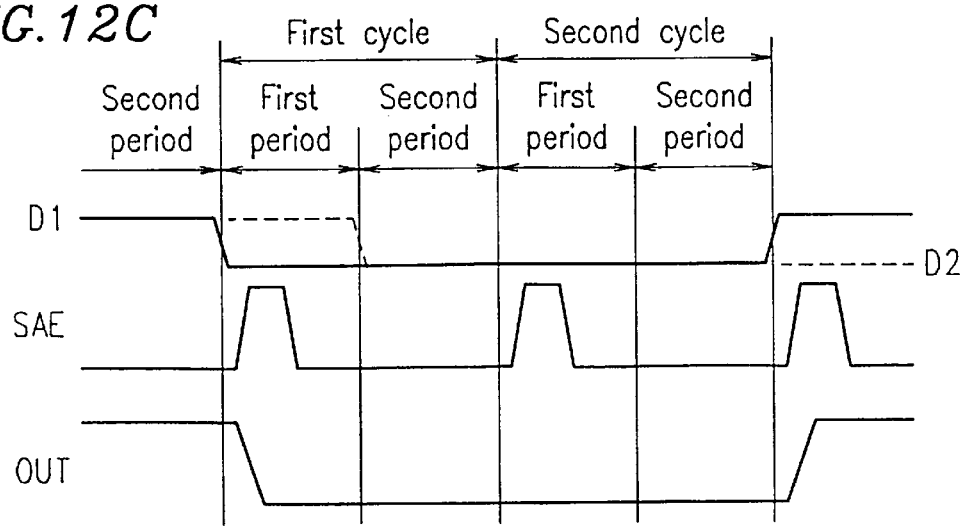

If the activation signal SAE makes a transition from a high level to a low level, the MOS transistors 53 and 54 make a transition from an on-state to an off-state. In this case, the output data is held by the latch circuit 55. As a result, voltage potentials at the gates of the MOS transistors 41 and 42 become fixed. Therefore, even in a case where the MOS transistors 53 and 54 become an on-stage again in the second cycle and no voltage potential difference occurs between the information voltage potentials D1 and D2, the differential amplifier 16 outputs correct data in accordance with the voltage potential difference between the gates of the MOS transistors 41 and 42 (see FIG. 12C).

The differential amplifier 15 (or differential amplifier 16) can in principle output data corresponding to the signal D0 without the MOS transistors 41 and 42. However, considering the fact that current difference is larger for a gate voltage potential difference than for a drain voltage potential difference for an MOS transistor and taking off-set voltage potential of the differential amplifier, etc., into consideration, it is preferable that the MOS transistors 41 and 42 are provided.

Also, in the present embodiment, it has been described that in a case where a signal having small amplitude and having successive information voltage potentials is transmitted to a receiver circuit, the differential amplifier having the latch function can be applied to the receiver circuit. For the same reason, even in a case where a signal having small amplitude and having reference voltage potentials and information voltage potentials which are repeated alternately is transmitted to a receiver circuit, the differential amplifier having the latch function can be applied to the receiver circuit.

EXAMPLE 3

FIG. 13A illustrates a construction of a receiver circuit 13 according to the present invention. The receiver circuit 13 includes a signal dividing circuit 14 which divides signals D0 transmitted through a signal line 1 in a time-sharing manner and an amplifier 5 which amplifies an output from the signal dividing circuit 14.

The signal dividing circuit 14 includes a signal line 6, a signal line 7, and a delay circuit 60. The signal line 1 branches into the signal line 6 and the signal line 7 within the signal dividing circuit 14. The signal line 6 is directly connected to the signal line 1, and the signal line 7 is connected to the signal line 1 via the delay circuit 60. The delay circuit 60 delays the signal D0 from the signal line 1 and transmits the delayed signal D0 to the signal line 7. The delay circuit 60 includes, for example, a resistor 63 and a capacitor 64. In FIG. 13A, reference numeral 8 denotes a capacitance of the signal line 1.

The receiver circuit 13 operates properly when it receives a signal D0 having reference voltage potentials and information voltage potentials which are repeated alternately through the signal line 1 (see FIG. 13B). The receiver circuit 13 also operates properly when it receives a signal D0 having successive information voltage potentials through the signal line 1 (see FIG. 13C). The signal D0 having reference voltage potentials and information voltage potentials which are repeated alternately is generated, for example, by the driver circuit 2 illustrated in FIG. 3A (or FIG. 4A). The signal D0 having successive information voltage potentials is generated, for example, by the driver circuit 12 illustrated in FIG. 9A.

Hereinafter, the operation of the receiver circuit 13 will be described.

When voltage potential of the signal D0 makes a transition from high to low (or from low to high), the voltage potential D1 of the signal line 6 makes a transition from high to low (or from low to high) almost simultaneously with the voltage potential of the signal D0. On the other hand, the voltage potential D2 of the signal line 7 makes a transition from high to low (or from low to high) with a delay of prescribed time duration from the time of the transition of the voltage potential of the signal D0 by the delay circuit 60. Accordingly, a voltage potential difference occurs between the voltage potentials D1 and D2 of the signal lines 6 and 7, respectively, during a period after the voltage potential of the signal D0 made the transition.

The differential amplifier 5 takes the voltage potential D2 of the signal line 7 as reference voltage potential and judges whether the voltage potential D1 of the signal line 6 is higher or lower than the reference voltage potential. The differential amplifier 5 outputs an output signal OUT in accordance with the judgment result. This makes it possible to transmit data corresponding to the signal D0.

In the example illustrated in FIG. 13A, the delay circuit 60 includes the resistor 63 and the capacitor 64. However, the construction of the delay circuit 60 is not limited thereto. As long as it has the function of delaying transmission of signals, The delay circuit 60 can be of any construction.

Moreover, the use of the receiver circuit 13 is particularly effective for a case where a clock signal is transmitted. This is because the receiver circuit 13 does not require a clock CLK as shown in FIG. 5. This eliminates the contradiction that a clock CLK is required for transmitting a clock signal.

According to the signal dividing circuit 14 in the receiver circuit 13, the larger the phase difference between the information voltage potentials D1 and D2 (period where the voltage potentials difference is held) is, the better the certainty of the signal transmission is. However, if the phase difference is too large, self-equalization of the information voltage potentials D1 and D2 is not finished before the next cycle begins. As a result, there is a risk of erroneously operating the signal dividing circuit 14.

The delay time in the signal dividing circuit 14 (i.e., phase difference between the information voltage potentials D1 and D2) is constant irrespective of an operation frequency. Accordingly, in a case where a preset operation frequency is extremely high or low with respect to the delay time, it becomes impossible to accurately perform signal transmissions.

Figure 14A:
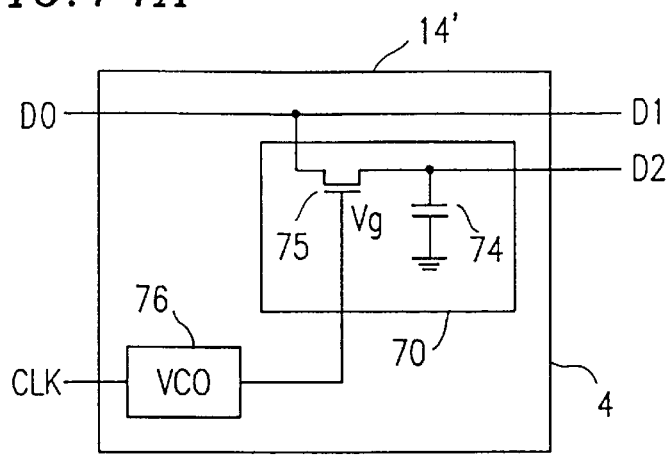
FIG. 14A is a view illustrating a construction of a signal dividing circuit 14'.

FIG. 14A illustrates a construction of a signal dividing circuit 14' which is a modified version of the signal dividing circuit 14. The signal dividing circuit 14' is intended to solve the above-mentioned problem.

The signal dividing circuit 14' includes a delay circuit 70 which delays signals D0 from the signal line 1 and an adjusting circuit 76 which adjusts the delay time of the delay circuit 70 in accordance with the frequency of an external clock CLK.

The adjusting circuit 76 is used for purposes of adjusting the operation speed in accordance with the frequency of the external clock CLK. As the adjusting circuit 76, for example, a VCO circuit which changes an output voltage potential in accordance with the frequency of the external clock CLK is used. The VCO circuit is generally used in a PLL circuit. In the following description, it is assumed that the adjusting circuit 76 is a VCO circuit.

The delay circuit 70 includes a capacitor 74 and an NMOS transistor 75. An output voltage potential of the VCO circuit 76 is input to the gate of the NMOS transistor 75. In a case where the VCO circuit 76 is configured such that the output voltage potential of the VCO circuit 76 becomes higher as the frequency of the clock CLK becomes higher, the higher the frequency of the clock CLK is, the higher the gate voltage potential $V_g$ of the NMOS transistor 75 becomes. As a result, a resistance of the channel of the NMOS transistor 75 decreases. That is, the higher the frequency of the clock CLK is, the smaller the resistance component which causes a delay in the delay circuit 70 becomes. Consequently, the phase difference between the information voltage potentials D1 and D2 becomes small.

Figure 14B:
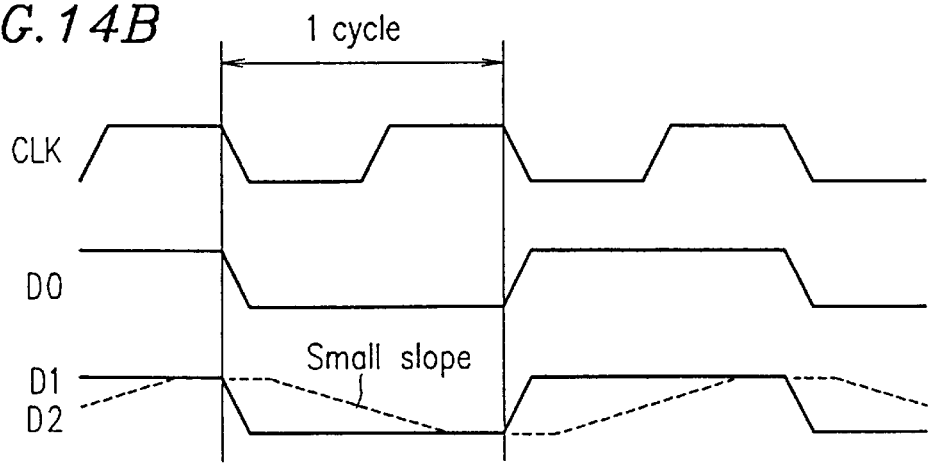
FIGS. 14B and 14C are time charts illustrating the operation of the signal dividing circuit 14'.
Figure 14C:
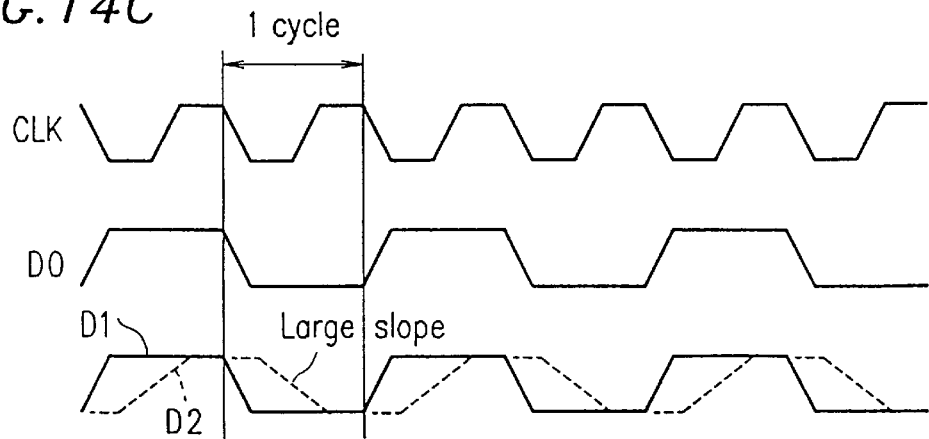

FIG. 14B illustrates the operation of the signal dividing circuit 14' in a case where the operation period is relatively long. FIG. 14C illustrates the operation of the signal dividing circuit 14' in a case where the operation period is relatively short. According to the signal dividing circuit 14', in either case, the transition of the voltage potential of the information voltage potential D2 is completed before the end of one cycle while sufficiently maintaining the phase difference between the information voltage potentials D1 and D2, without affecting the next cycle. This means that optimum signal division in accordance with the operation frequency is possible.

The resistance component of the delay circuit 70 is not limited to an on-resistance of the NMOS transistor 75. A device having a resistance may be disposed either in parallel or in series with respect to the NMOS transistor 75 as a resistance component of the delay circuit 70.

Moreover, instead of the NMOS transistor 75, a device whose resistance and/or capacitance change in accordance with the operation frequency may be used as a constituent element for adjusting the delay time of the delay circuit 70 in accordance with the operation frequency.

The signal transmission circuit according to the present invention has the advantage of high noise resistance and thus providing a noise margin. Moreover, since reference voltage potential and signal voltage potential (i.e., complementary date) can be transmitted by using only a single signal line, there is the advantage of requiring small layout area for the signal transmission circuit. Furthermore, since the amplitude of the signal transmitted through the single signal line is small, there is the advantage of small power consumption of the signal transmission circuit.

As described above, the signal transmission circuit according to the present invention is superior to a conventional signal transmission circuit in that it simultaneously realizes the three characteristics of small power consumption, small layout area, and high noise resistance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A driver circuit which drives a signal line, comprising:
   an input for receiving an input signal;
   a first output section for outputting a reference voltage potential to said signal line during a first period, said outputting of said reference voltage potential being substantially independent of the input signal; and
   a second output section for outputting one of a first information voltage potential and a second information voltage potential to said signal line in accordance with the input signal during a second period,
   wherein said first period and said second period are alternately and periodically repeated.

2. A driver circuit according to claim 1, wherein each of said first output section and said second output section is controlled by a clock signal.

3. A signal transmission circuit comprising:
   a receiver circuit, including:
      an input for receiving an input signal transmitted through a first signal line;
      a second signal line having a predetermined capacitance;
      a third signal line having a predetermined capacitance;
      a control section for connecting said first signal line and said second signal line during a first period and for connecting said first signal line and said third signal line during a second period; and
      an amplifier for amplifying a voltage potential difference between a voltage potential of said second signal line and a voltage potential of said third signal line, so as to generate an output signal, and
   a driver circuit for producing the input signal and providing the input signal to the first signal line, the driver circuit being operatively configured to produce the input signal having a reference voltage potential during said first period and having one of a first information voltage potential and a second information voltage potential during said second period, said reference voltage potential being between said first information voltage potential and said second information voltage potential, and said first period and said second period being alternately and periodically repeated.

4. A signal transmission circuit according to claim 3, wherein said control section comprises:
   a first switch for connecting said first signal line and said second signal line; and
   a second switch for connecting said first signal line and said third signal line, wherein said first switch and said second switch are controlled by a clock signal.

5. A signal transmission circuit according to claim 4, wherein operation of said first switch and said second switch as controlled by said clock signal is synchronous with data provided by said input signal.

6. A signal transmission circuit according to claim 3, wherein said amplifier comprises a holding circuit for holding an output of said amplifier.

7. A signal transmission circuit comprising:
   a receiver circuit, including:
      an input for receiving an input signal transmitted through a first signal line;
      a delay circuit for delaying said input signal by a predetermined time duration; and
      an amplifier for amplifying a voltage potential difference between a voltage potential of said input signal and a voltage potential of said delayed input signal, so as to generate an output signal, and
   a driver circuit for producing the input signal and providing the input signal to the first signal line, the driver circuit being operatively configured to produce the input signal having a reference voltage potential during a first period and having one of a first information voltage potential and a second information voltage potential during a second period, said reference voltage potential being between said first information voltage potential and said second information voltage potential, and said first period and said second period being alternately and periodically repeated.

8. A signal transmission circuit according to claim 7, the circuit further comprising:
   an adjusting circuit for adjusting said delay time duration in accordance with a clock signal. z 9. A signal transmission circuit according to claim 9, wherein said amplifier comprises a holding circuit for holding an output of said amplifier.

10. A method for transmitting a signal from a driver circuit to a receiver circuit through a first signal line, said signal having a reference voltage potential during a first period and having one of a first information voltage potential and a second information voltage potential during a second period, said reference voltage potential being substantially independent of information input to said driver circuit, said first information voltage potential and said second information voltage potential depending on said information input to said driver circuit, said first period and said second period being alternately and periodically repeated, said receiver circuit having a second signal line and a third signal line, said method comprising the steps of:
   receiving said signal having said reference voltage potential on said second signal line;
   receiving said signal having one of said first information voltage potential and said second information voltage potential on said third signal line;
   comparing a voltage potential of said second signal line with a voltage potential of said third signal line; and
   generating an output signal in accordance with the comparison result.

11. A method according to claim 10, wherein said first period and said second period are substantially equal to one-half a period in which said receiver circuit compares said voltage potential of said second signal line with said voltage potential of said third signal line.

12. A method for transmitting a signal from a driver circuit to a receiver circuit through a first signal line, said signal having a reference voltage potential during a first period and having one of a first information voltage potential and a second information voltage potential during a second period, said reference voltage potential being substantially independent of information input to said driver circuit, said first information voltage potential and said second information voltage potential depending on said information input to said driver circuit, said first period and said second period being alternately and periodically repeated, said receiver circuit having a second signal line and a third signal line, said method comprising the steps of:

- receiving said signal on one of said second signal line and said third signal line;
- delaying said signal by a predetermined time duration;
- receiving said delayed signal on the other of said second signal line and said third signal line;
- comparing a voltage potential of said second signal line with a voltage potential of said third signal line; and
- generating an output signal in accordance with the comparison result.

13. A method according to claim 12, wherein said first period and said second period are substantially equal to a period in which said receiver circuit compares said voltage potential of said second signal line with said voltage potential of said third signal line.

14. A receiver circuit comprising:

- an input for receiving an input signal transmitted through a first signal line;
- a delay circuit for delaying said input signal by a predetermined delay time duration;
- an adjusting circuit for adjusting said delay time duration in accordance with a clock signal; and
- an amplifier for amplifying a voltage potential difference between a voltage potential of said input signal and a voltage potential of said delayed input signal, so as to generate an output signal, wherein said input signal has a reference voltage potential during a first period and has one of a first information voltage potential and a second information voltage potential during a second period, said reference voltage potential is between said first information voltage potential and said second information voltage potential, and said first period and said second period are alternately and periodically repeated.

* * * * *